United States Patent [19]
Konya et al.

[11] Patent Number: 5,436,182
[45] Date of Patent: Jul. 25, 1995

[54] METHOD OF MANUFACTURING THIN FILM TRANSISTOR PANEL

[75] Inventors: Naohiro Konya; Makoto Sasaki, both of Tokyo, Japan

[73] Assignee: Casio Comupter Co., Ltd., Tokyo, Japan

[21] Appl. No.: 63,000

[22] Filed: May 17, 1993

[30] Foreign Application Priority Data

May 19, 1992 [JP] Japan .................................. 4-150058

[51] Int. Cl.⁶ .............................................. H01L 21/86
[52] U.S. Cl. ............................ 437/40; 437/246; 437/51; 148/DIG. 105
[58] Field of Search .............. 437/40, 41, 245, 246, 437/913, 101, 51; 148/DIG. 105

[56] References Cited

U.S. PATENT DOCUMENTS

| | | | |
|---|---|---|---|
| 4,933,296 | 6/1990 | Parks et al. | 437/40 |
| 5,032,531 | 7/1991 | Tsutsui et al. | 437/40 |
| 5,032,536 | 7/1991 | Oritsuki et al. | 437/41 |
| 5,137,841 | 8/1992 | Takeda et al. | 437/101 |
| 5,153,754 | 10/1992 | Whetten | 437/101 |
| 5,156,986 | 10/1992 | Wei et al. | 437/40 |
| 5,166,085 | 11/1992 | Wakai et al. | 437/101 |

FOREIGN PATENT DOCUMENTS

| | | |
|---|---|---|
| 0387892 | 9/1990 | European Pat. Off. . |
| 61-193128 | 8/1986 | Japan . |
| 63-81975 | 4/1988 | Japan ................................ 437/61 |
| 63-215078 | 9/1988 | Japan ................................ 437/984 |
| 2-72330 | 3/1990 | Japan . |
| 2134707 | 8/1984 | United Kingdom . |

OTHER PUBLICATIONS

Wolf, et al, "Silicon Processing for the VLSI ERA"; vol. 1, 1986 pp. 441–442.

*Primary Examiner*—Brian E Hearn
*Assistant Examiner*—Michael Trinh
*Attorney, Agent, or Firm*—Frishauf, Holtz, Goodman & Woodward

[57] ABSTRACT

A thin-film transistor panel is constituted by forming, on an insulating substrate, a plurality of thin-film transistors, a plurality of gate lines for each connecting gate electrodes of the thin-film transistors, and a plurality of pixel electrodes formed of a transparent conductive film connected to the thin-film transistors, then forming a low-resistance metal film of an Al or Al alloy for a data line and a surface metal film of Cr with a high density, forming a photoresist film of a predetermined pattern on the surface metal film, and etching the data line metal film and surface metal film. Then, the surface metal film remaining on the data line metal film is eliminated.

6 Claims, 5 Drawing Sheets

METHOD OF MANUFACTURING THIN FILM TRANSISTOR PANEL

BACKGROUND OF THE INVENTION

1. Field of the Invention

The present invention relates to a method of manufacturing a thin-film transistor panel used for an active matrix liquid crystal display device.

2. Description of the Related Art

A thin-film transistor panel (hereinafter referred to as "TFT panel") is used for an active matrix liquid crystal display device. This TFT panel has a transparent substrate of glass or the like, on which gate lines, thin-film transistors (TFTs), pixel electrodes connected to the source electrodes of the associated TFTs, and data lines are provided.

FIGS. 7 and 8 are a cross-sectional view and a plan view of part of a conventional TFT panel, respectively. A gate line G1 and a TFT 2 are formed on a transparent substrate 1 of glass or the like.

The TFT 2 comprises a gate electrode Ga formed from the gate line G1, a gate insulating film 3 of SiN (silicon nitride) formed on the gate electrode Ga, an i-type semiconductor layer 4 of a-Si (amorphous silicon) formed opposite to the gate electrode Ga on the gate insulating film 3, n-type semiconductor layers 5 of a-Si, doped with n-type impurities and formed on the i-type semiconductor layer 4 with a channel region therebetween, and a source electrode So and a drain electrode Do both formed on the n-type semiconductor layers 5. The gate line G1 is formed of Al (aluminum), a low-resistance metal, or an Al base alloy consisting of Al and a high-melting point metal such as Ti (titanium). The source and drain electrodes So and Do are formed of metal, such as Cr (chromium), which provides a good ohmic contact to the n-type semiconductor layer 5.

A blocking insulating film 6 of SiN is formed on the channel region of the i-type semiconductor layer 4 to protect the i-type semiconductor layer 4 against any damage at the time etching is conducted to isolate the n-type semiconductor layer 5 in the channel region.

The gate insulating film (transparent film) 3 of the TFT 2 is formed nearly over the entire surface of the substrate 1, covering the whole gate line G1 except for its terminal portion. A pixel electrode 7 is formed on the gate insulating film 3. This pixel electrode 7, formed by a transparent conductive film of ITO or the like, has one end edge connected to the source electrode So of the TFT 2.

The data line D1, which is connected to the drain electrode Do of the TFT 2, is provided on an interlayer insulating film 8 of SiN, which is so formed as to cover the TFT 2 and pixel electrode 7. This data line D1 is coupled to the drain electrode Do through a contact hole 9 formed in the interlayer insulating film 8. Like the gate line G1, the data line D1 is formed of Al, a low-resistance metal, or an Al base alloy. Reference numeral "10" denotes an overcoat insulating film of SiN.

The above TFT panel is manufactured through the following processes. The gate line G1, TFT 2 and pixel electrode 7 are formed on the substrate 1 by a well-known method. The interlayer insulating film (SiN film) 8 is then deposited on the resultant structure by a plasma CVD apparatus. After the contact hole 9 is formed in this interlayer insulating film 8 using a photolithography technique, a metal film (Al or Al base alloy film) for a data line is deposited on the interlayer insulating film 8 by a sputtering apparatus. Then, this data line metal film is patterned using a photolithography technique to form the data line D1. Finally, the overcoat insulating film (SiN film) 10 is deposited on the resultant structure by the plasma CVD apparatus.

In this TFT panel manufacturing method, as the TFT 2 and pixel electrode 7 formed on the substrate 1 are covered with the interlayer insulating film 8 on which the data line D1 is formed, even if the data line D1 is formed of Al or Al base alloy, the pixel electrode 7 will not be damaged at the time a resist mask is formed for patterning the data line metal film.

While a metal film of Al or Al base alloy has a low resistance and good conductivity, it is likely to have pin holes.

It is know that a resist mask is formed by coating a photoresist on the data line metal film and then subjecting this photoresist to exposure and developing processes. In this case, if the data line metal film is an Al film or Al base alloy film having pin holes, a developer solution penetrates through those pin holes to the back of this metal film at the time the photoresist is developed.

The developer solution is an electrolytic solution. If the pixel electrode 7 is in direct contact with the data line metal film, therefore, the electrolytic effect of the developer solution that has penetrated through the pin holes of the data line metal film causes a cell reaction between the pixel electrode 7 of ITO or the like and this metal film of Al or Al base alloy. This would cause a melt defect on the pixel electrode 7 of ITO or the like, or would result in separation of the pixel electrode 7 from the gate insulating film 3.

When the TFT 2 and pixel electrode 7 formed on the substrate 1 are covered with the interlayer insulating film 8 and the data line D1 is formed on the insulating film 8 as mentioned above, even if the data line D1 is an Al or Al base alloy film having pin holes and the developer solution penetrates through those pin holes, no cell reaction would occur between the pixel electrode 7 and the data line metal film. Therefore, the pixel electrode 7 will not be damaged at the time a resist mask is formed on the data line metal film.

But, the conventional method requires the deposition of the interlayer insulating film 8 on the substrate 1 to cover the TFT 2 and pixel electrode 7. As mentioned above, the interlayer insulating film (SiN film) 8 is formed by a plasma CVD apparatus. This film deposition by the plasma CVD apparatus takes time, thus resulting in a poor performance of manufacturing a TFT panel. In addition, this plasma CVD apparatus is large and expensive, so that the production equipment becomes large and a large amount of cost is required accordingly.

SUMMARY OF THE INVENTION

It is therefore an object of the present invention to provide a method of manufacturing a TFT panel, which can eliminate an interlayer insulating film that is to be formed between a thin-film transistor and pixel electrode and a data line to improve the manufacturing efficiency, and does not need large production equipment.

To achieve the foregoing object, a method of manufacturing a TFT panel according to the present invention comprises:

a first step of forming, on an insulating substrate, a plurality of thin-film transistors, a plurality of gate lines for each connecting gate electrode of the thin-film transistors, and a plurality of pixel electrodes formed of a transparent conductive film connected to the thin-film transistors;

a second step of forming a first metal film with a low resistance and a second metal film with a high density in such a way as to cover the plurality of thin-film transistors and the plurality of pixel electrodes formed in the first step;

a third step of forming a photoresist film on the second metal film formed in the second step, and exposing and developing the photoresist to form a resist pattern of a predetermined shape; and a fourth step of etching the first metal film and second metal film formed in the second step, with the resist pattern formed in the third step.

According to this method, as the second metal film with a high density is deposited on the first metal film for forming a data line and a resist mask is formed on the second metal film, the penetration of the developer solution can be blocked by the second metal film on the first metal film at the time the photoresist, which will serve as the resist mask, is developed. Even if the low-resistance first metal film has pin holes, the developer solution will not penetrate the pin holes. Even without an interlayer insulating film to cover the TFTs and pixel electrodes, therefore, the pixel electrodes will not be damaged at the time the resist mask is formed to pattern the first metal film to provide the data line.

Since the present method requires no interlayer insulating film whose formation takes time and the second metal film can be formed on the first metal film by a sputtering apparatus in a short period of time, TFT panels can be manufactured efficiently and no large production equipment is needed.

The second metal film, one of the two metal films formed into a predetermined shape in the fourth step, is removed after the fourth step. This will eliminate the conventionally probable later separation of the second metal film, which may short-circuit the TFTs or the electrodes.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

First Embodiment

Figure 1A:
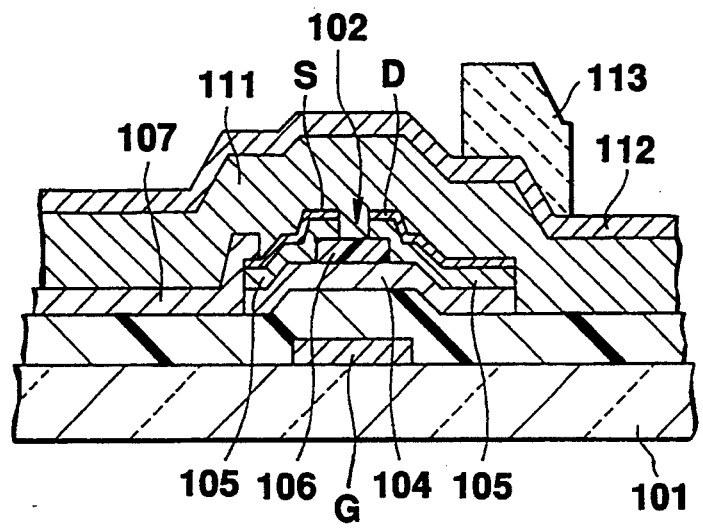
FIGS. 1A through 1C are cross sectional views illustrating step-by-step procedures of manufacturing a TFT panel according to a first embodiment of the present invention.
Figure 1B:
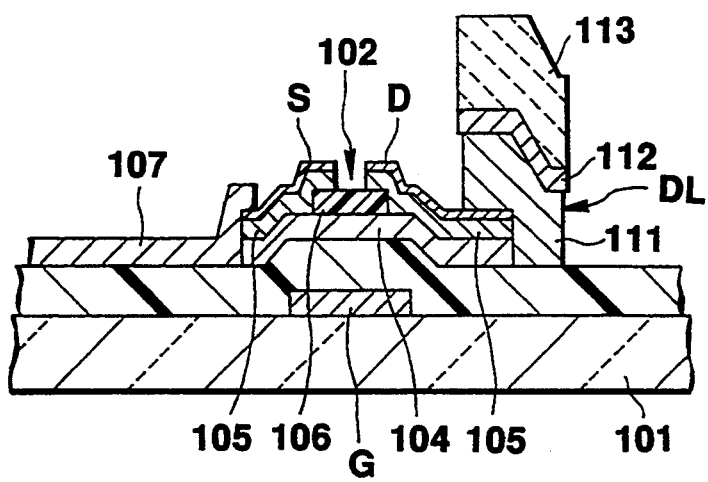
Figure 1C:
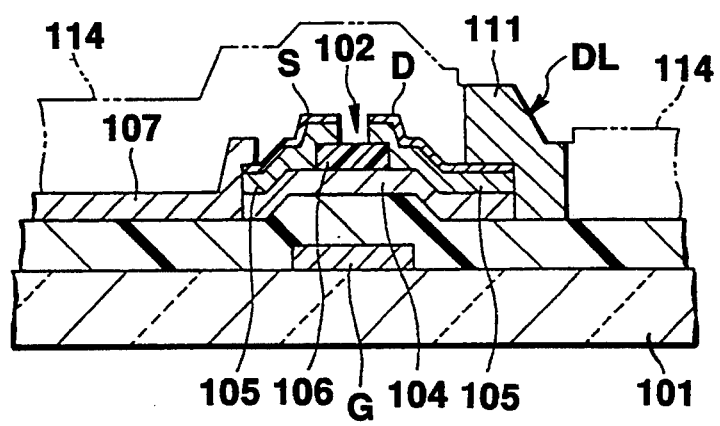
Figure 2:
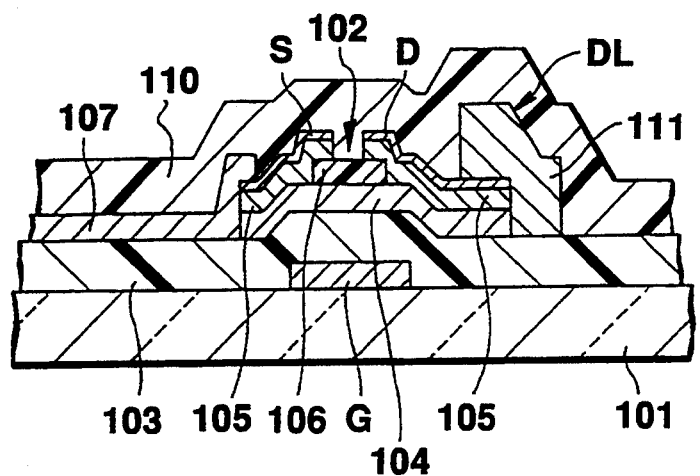
FIG. 2 is a cross-sectional view showing, in enlargement, a part of the TFT panel manufactured by the method of the first embodiment of the present invention.
Figure 3:
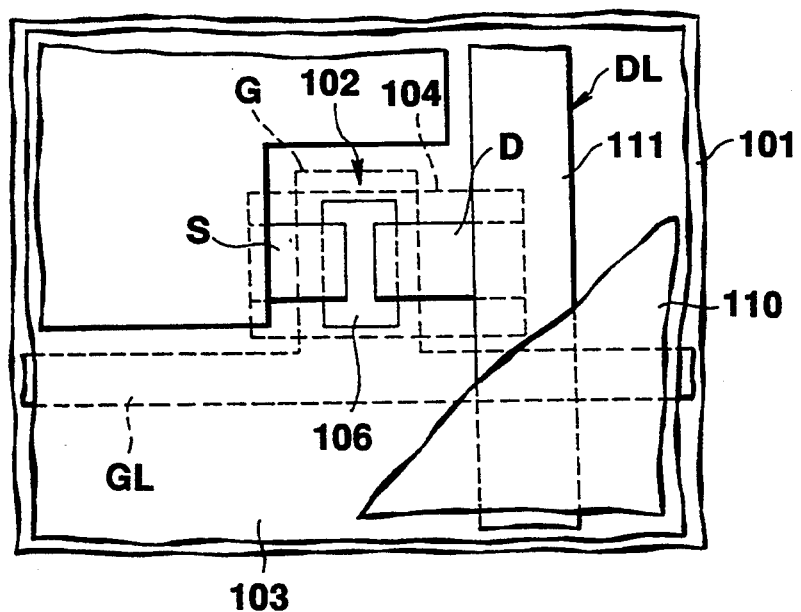
FIG. 3 is a plan view showing, in enlargement, a part of the TFT panel manufactured by the method of the first embodiment of the present invention.

A first embodiment of the present invention will now be described referring to FIGS. 1A through 3. FIGS. 1A through 1C present cross sections illustrating step-by-step procedures of manufacturing a TFT panel according to the first embodiment. FIGS. 2 and 3 are respectively cross-sectional and plan views showing, in enlargement, a part of the manufactured TFT panel.

Referring to FIGS. 2 and 3, a TFT panel has an insulating substrate 101 on which a plurality of TFTs 102, a plurality of gate lines GL for supplying a gate signal to the gate electrodes of the TFTs, pixel electrodes 107 connected to the associated TFTs, and data lines DL for supplying a data signal to the TFTs are provided. The substrate 101, on which the gate lines GL and TFTs 102 are formed, is made of a transparent material, such as glass.

Each TFT 102 comprises a gate electrode G formed from the associated gate line GL, a gate insulating film 103 of SiN (silicon nitride) formed on the gate electrode G, an i-type semiconductor layer 104 of a-Si (amorphous silicon) formed opposite to the gate electrode G on the gate insulating film 103, two n-type semiconductor layers 105 of a-Si, doped with n-type impurities and formed on the i-type semiconductor layer 104 with a channel region therebetween, and a source electrode S and a drain electrode D both formed on the n-type semiconductor layer 105. The gate line GL is formed of Al (aluminum), a low-resistance metal, or an Al base alloy consisting of Al and a high-melting point metal such as Ti (titanium). The source and drain electrodes S and D are formed of metal, such as Cr (chromium), which provides a good ohmic contact to the n-type semiconductor layer 105.

A blocking insulating film 106 of SiN is formed on the channel region of the i-type semiconductor layer 104 to protect the i-type semiconductor layer 104 against any damage at the time etching is conducted to isolate the n-type semiconductor layer 105 in the channel region.

The gate insulating film (transparent film) 103 of the TFT 102 is formed nearly over the entire surface of the substrate 101, covering the whole gate line GL except for its terminal portion. A pixel electrode 107 is formed on the gate insulating film 103. This pixel electrode 107, formed by a transparent conductive film of ITO or the like, has one end edge connected to the source electrode S of the TFT 102.

The data line DL, which is connected to the drain electrode D of the TFT 102, is formed in contact with the drain electrode D. Like the gate line GL, the data line DL is formed of Al, a low-resistance metal, or an Al base alloy. Reference numeral "110" denotes an overcoat insulating film of SiN.

A method of manufacturing the above-described TFT panel will be explained below referring to FIGS. 1A through 1C.

Step 1

First, as shown in FIG. 1A, after the gate line GL, TFT 102 and pixel electrode 107 are formed on the substrate 101 by a well-known method, a data line metal film 111 of Al or Al base alloy is deposited directly on the resultant structure, and a surface metal film 112 of Cr or the like with a high density is deposited on this metal film 111. The metal film 111 and surface metal film 112 are formed continuously by a sputtering apparatus.

Step 2

Next, as shown in FIG. 1A, a resist mask 113 is formed on the surface metal film 112 in a data line pattern. This resist mask 113 is formed by coating a photoresist on the surface metal film 112 and then exposing and developing the photoresist.

In this case, the developing of the photoresist is conducted by dipping the substrate 101 in a developer solution or spraying the developer solution over the photoresist. As the photoresist is coated on the surface metal film 112 with a high density which covers the data line metal film 111, the developer solution is blocked by the surface metal film 112.

Even if the data line metal film 111 of Al or Al base alloy has pin holes, the developer solution will not penetrate through those pin holes. Accordingly, no cell reaction would occur between the pixel electrode 107 of ITO or the like and the data line metal film 111, so that the pixel electrode 107 will not be damaged at the time the resist mask 113 is formed.

Step 3

Then, the surface metal film 112 and data line metal film 111 are continuously etched into a pattern of the data line DL as shown in FIG. 1B. The etching of the data line metal film 111 is carried out using an etching solution which has a large etching selecting ratio to the source and drain electrodes S and D of the TFT 102 and the pixel electrode 107.

In this case, while the side of the data line metal film 111 is etched by some degree during etching, the surface metal film 112 of Cr or the like is hardly etched after the step progresses to the etching of the metal film 111. The patterned surface metal film 112 on the data line DL extends outside the data line metal film 111 as shown in FIG. 1B. If this extension is large, the extending portion of the surface metal film 112 may be chipped off onto the substrate 101 during the manufacturing process, thus causing short circuit between the source and drain electrodes S and D of the TFT 102.

Step 4

In this embodiment, therefore, after the data line DL is formed and the resist mask 113 is then eliminated, the surface metal film 112 on the data line DL is etched out to thereby prevent the TFT 102 from being short-circuited by the chipped-off piece of the extending portion of the surface metal film 112.

The etching of the surface metal film 112 is carried out using an etching solution which has a large etching selecting ratio to the data line metal film 111, and while covering the TFT 102 and pixel electrode 107 on the substrate 101 with a resist mask 114.

This resist mask 114 is formed by coating a photoresist on the substrate 101 and then exposing and developing the photoresist. The data line metal film 111 of Al or Al base alloy is not present on the pixel electrode 107 yet at this time, and the photoresist on the pixel electrode 107 will not be eliminated by the developing process, preventing the developer solution from reaching the pixel electrode 107. Therefore, no cell reaction would occur between the pixel electrode 107 and the data line metal film 111, so that the pixel electrode 107 will not be damaged at the time the resist mask 114 is formed.

Step 5

Then, the resist mask 114 is eliminated, followed by the deposition of the overcoat insulating film (SiN film) 110 by a plasma CVD apparatus, completing the TFT panel as shown in FIGS. 2 and 3.

According to this method, as the surface metal film 112 of Cr or the like with a high density is deposited on the data line metal film 111 and the resist mask 113 is then formed on the surface metal film 112, the penetration of the developer solution can be blocked by the surface metal film 112 on the data line metal film 111 at the time the photoresist, which will serve as the resist mask 113, is developed. Even if the data line metal film 111 of Al or Al base alloy has pin holes, the developer solution will not penetrate the pin holes. Even without an interlayer insulating film to cover the TFT 102 and pixel electrode 107, unlike in the conventional manufacturing method, the pixel electrode 107 will not be damaged at the time the resist mask 113 is formed to pattern the data line metal film 111.

Since the present method requires no interlayer insulating film whose formation takes time and the surface metal film 112 can be formed on the data line metal film 111 by the sputtering apparatus in a short period of time, TFT panels can be manufactured efficiently.

In addition, according to this embodiment, after the data line DL is formed by patterning the surface metal film 112 and data line metal film 111, the surface metal film 112 on the data line DL is etched out. Even if the patterned surface metal film 112 on the data line DL extends outside the data line metal film 111 by the side etching of this metal film 111, it is possible to prevent the TFT 102 from being short-circuited by the extending portion of the surface metal film 112 even when it is chipped off during the later manufacturing process.

Second Embodiment

Figure 4A:
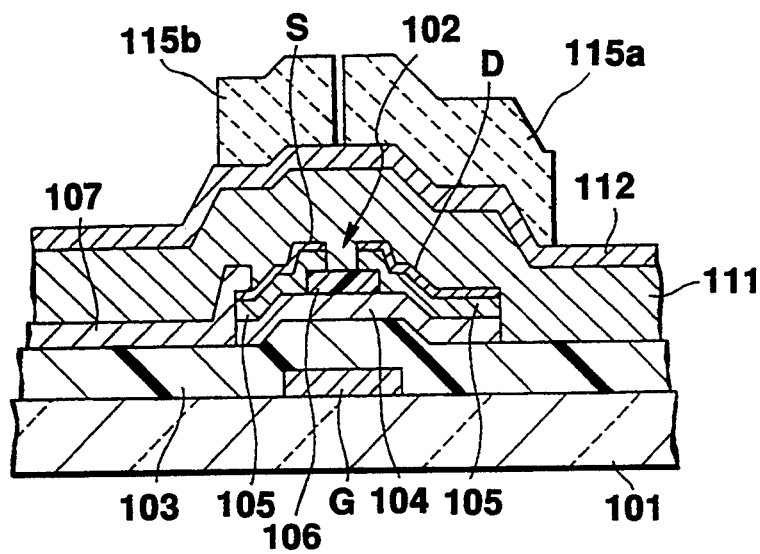
FIGS. 4A through 4C are cross sectional views illustrating step-by-step procedures of manufacturing a TFT panel according to a second embodiment of the present invention.
Figure 4B:
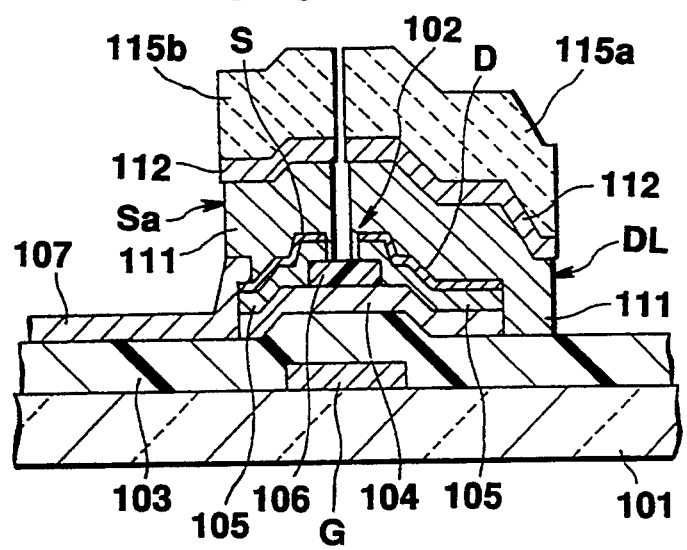
Figure 4C:
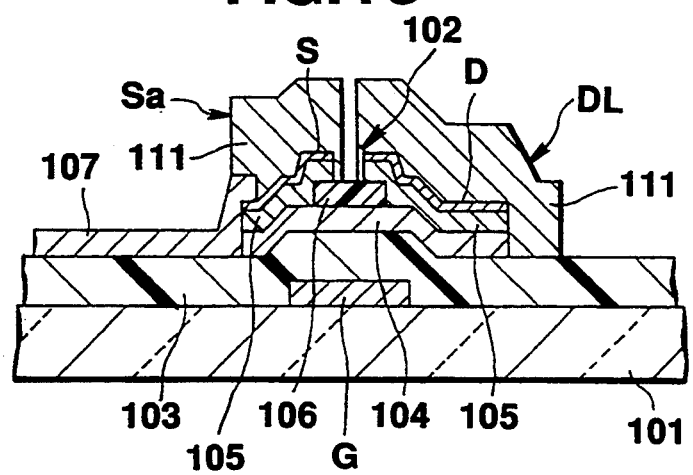
Figure 5:
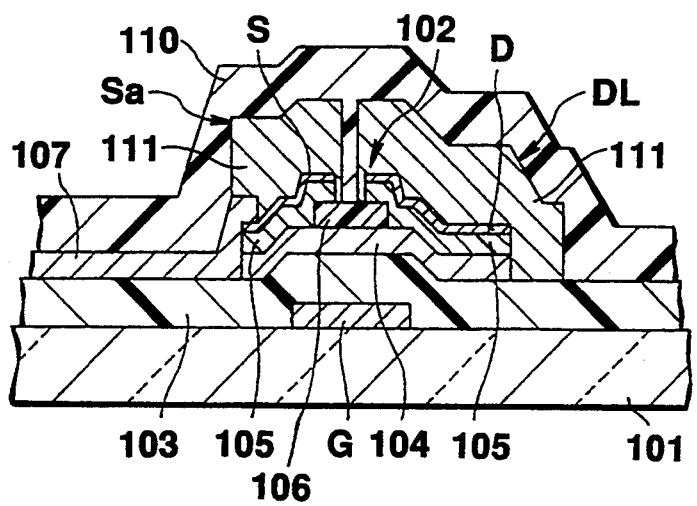
FIG. 5 is a cross-sectional view showing, in enlargement, a part of the TFT panel manufactured by the method of the second embodiment of the present invention.
Figure 6:
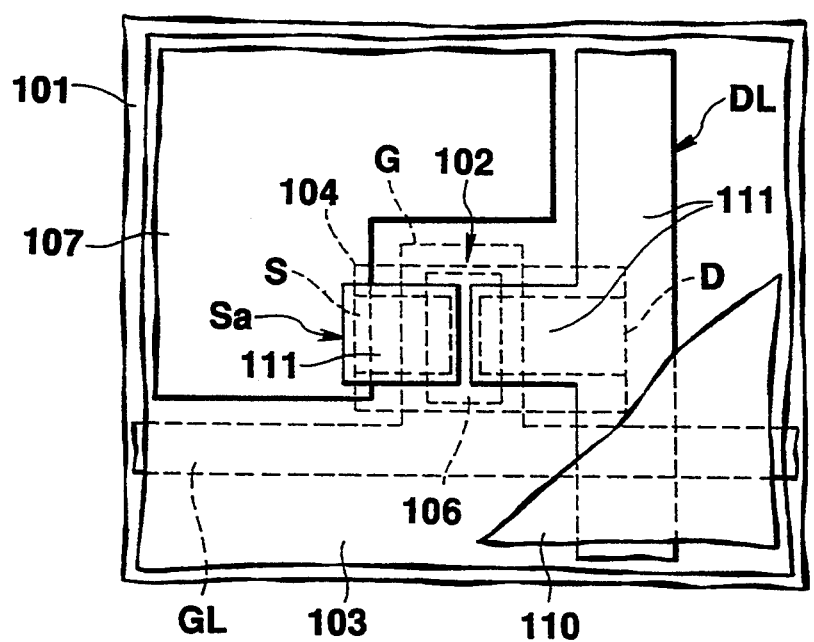
FIG. 6 is a plan view showing, in enlargement, a part of the TFT panel manufactured by the method of the second embodiment of the present invention.
Figure 7:
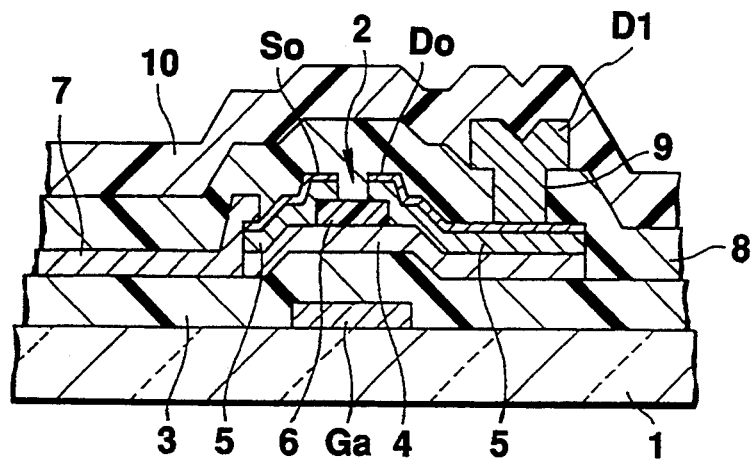
FIG. 7 is a cross sectional view showing, in enlargement, a part of a conventional TFT panel.
Figure 8:
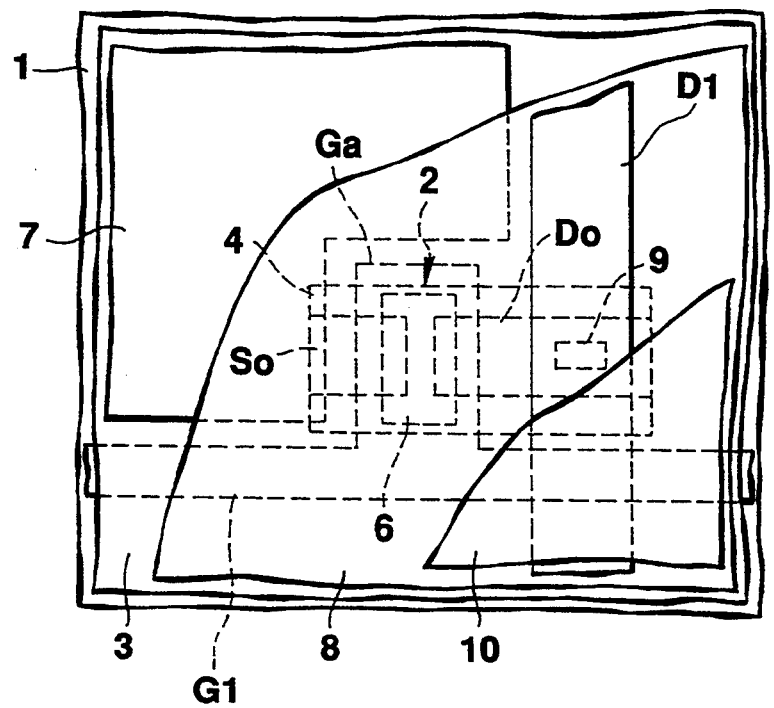
FIG. 8 is a plan view showing, in enlargement, a part of the conventional TFT panel.

A second embodiment of the present invention will now be described referring to FIGS. 4A through 6. FIGS. 4A through 4C present cross sections illustrating step-by-step procedures of manufacturing a TFT panel according to the first embodiment. FIGS. 5 and 6 are respectively cross-sectional and plan views showing, in enlargement, a part of the manufactured TFT panel. Same or like reference numerals will be given to those elements of the second embodiment which correspond to the elements of the first embodiment shown in FIGS. 1A to 3 to avoid their redundant description.

In this embodiment, unlike in the first embodiment, etching to eliminate the surface metal film 112 on the data line DL is conducted without forming the resist mask 114.

Step 1

First, as shown in FIG. 4A, after the gate line GL, TFT 102 and pixel electrode 107 are formed on the substrate 101 by a well-known method, a data line metal film 111 of Al or Al base alloy is deposited directly on the resultant structure, and a surface metal film 112 of Cr or the like with a high density is deposited on this metal film 111.

Step 2

Next, as shown in FIG. 4A, a resist mask 115a having a shape, which corresponds to the pattern of the data line DL and has an extending portion formed on that portion corresponding to the drain electrode D of the TFT 102 so as to cover the entire drain electrode D, and a resist mask 115b having a shape to cover the entire source electrode S of the TFT 102, are formed on the surface metal film 112. The resist masks 115a and 115b are formed by coating a photoresist on the surface metal film 112 and then exposing and developing the photoresist. In this embodiment too, the photoresist is coated on the surface metal film 112 with a high density which covers the data line metal film 111, so that the developer solution can be blocked by the surface metal film 112.

Step 3

Then, as shown in FIG. 4B, the surface metal film 112 and data line metal film 111 are continuously etched into a pattern of the data line DL having an extending portion covering the drain electrode D of the TFT 102 and a pattern of a coating layer Sa covering the source electrode S of the TFT 102.

In this embodiment too, while the side of the data line metal film 111 is etched by some degree during etching, the surface metal film 112 of Cr or the like is hardly etched after the step progresses to the etching of the metal film 111. The patterned surface metal film 112 on the data line DL and the source electrode coating layer Sa extends outside the data line metal film 111 as shown in FIG. 4B.

Step 4

Then, the resist masks 115a and 115b are eliminated, and the surface metal film 112 on the data line DL and the coating layer Sa are etched out.

According to this embodiment, the surface metal film 112 and data line metal film 111 are patterned to have a shape of the data line DL having an extending portion covering the drain electrode D of the TFT 102 and a shape of the coating layer Sa covering the source electrode S of the TFT 102 in the above-described step 3. Therefore, the source and drain electrodes S and D of the TFT 102 are covered entirely with the data line metal film 111. If the etching of the surface metal film 112 is carried out using an etching solution which has a large etching selecting ratio to the data line metal film 111 and pixel electrode 107, the source and drain electrodes S and D of the TFT 102 will not be etched at the time the surface metal film 112 is etched. Also the pixel electrode 7 will not be etched or damaged at that time.

According to this embodiment, therefore, etching to eliminate the surface metal film 112 on the data line DL can be carried out without forming the resist mask 114 which is required in the first embodiment.

Step 5

Then, the overcoat insulating film (SiN film) 110 is deposited by the plasma CVD apparatus, completing the TFT panel as shown in FIGS. 5 and 6.

According to the manufacturing method of the second embodiment too, as the surface metal film 112 of Cr or the like with a high density is deposited on the data line metal film 111 and the resist masks 115a and 115b are then formed on the surface metal film 112, even without an interlayer insulating film to cover the TFT 102 and pixel electrode 107, the pixel electrode 107 will not be damaged at the time the resist masks 115a and 115b are formed to pattern the data line metal film 111. Therefore, TFT panels can be manufactured efficiently.

Further, since the etching of the surface metal film 112 after the patterning of the surface metal film 112 and the data line metal film 111 can be conducted without forming a resist mask, the second embodiment can make the TFT panel manufacturing process simpler than the first embodiment. In addition, since the source electrode S of the TFT 102 and the pixel electrode 107 are connected also by the low-resistance data line metal film 111 of Al or Al base alloy remaining on the source electrode S, it is possible to reduce the resistance of the junction between the source electrode S and pixel electrode 107.

Other Embodiment

In the first and second embodiments, the surface metal film 112 is eliminated after the surface metal film 112 and data line metal film 111 are patterned into the data line DL or after the data line DL and source electrode coating layer Sa are formed. If the extending portion of the surface metal film 112 is small, however, the surface metal film 112 may be left.

Additional advantages and modifications will readily occur to those skilled in the art. Therefore, the invention in its broader aspects is not limited to the specific details, illustrated examples shown and described herein. Accordingly, various modifications may be made without departing from the spirit or scope of the general inventive concept as defined by the appended claims and their equivalents.

What is claimed is:

1. A method of manufacturing a TFT panel comprising:
    a first step of forming, above an insulating substrate, a plurality of thin-film transistors each of which includes a gate electrode, a source electrode and a drain electrode, a plurality of gate lines, each connecting the gate electrodes of said thin-film transistors and a plurality of pixel electrodes, each formed of a transparent conductive film and connected to one of the source electrode and drain electrode of an associated one of said thin-film transistors; a second step of forming a first metal film with a low resistance on said plurality of thin-film transistors and said plurality of pixel electrodes and a second metal film on said first metal film, so that said second metal film blocks a developer solution for developing a photoresist from penetrating through pin holes of said first metal film;

a third step of forming a photoresist film on said second metal film, and exposing and developing said photoresist film with a developer solution to form resist patterns corresponding to data line formation regions;

a fourth step of etching said first metal film into data lines and said second metal film into a pattern corresponding to the data lines, with said resist patterns; and a fifth step of eliminating said second metal film after said second metal film is etched into the pattern corresponding to the date lines in said fourth step.

2. The method according to claim 1, wherein said fifth step includes:

a substep of forming a second photoresist film to cover at least the source electrodes and drain electrodes and being out of covering relation with said second metal film etched into the pattern corresponding to the data lines in said fourth step; and a substep of eliminating said second metal film by etching.

3. The method according to claim 1, wherein:

said third step includes a step of forming said resist pattern on the source electrodes and drain electrodes, and on the data line formation regions;

said fourth step includes a step of etching said first metal film and said second metal film with said resist pattern as a mask to allow said first and second metal films on said source and drain electrodes of said plurality of thin-film transistors to remain and to form data lines for connecting said drain electrodes; and said fifth step includes a step of eliminating said second metal film.

4. A method of manufacturing a TFT panel comprising:

a first step of forming a plurality of thin-film transistors, each including a gate electrode, a source electrode and a drain electrode, a plurality of gate lines connecting the gate electrodes, and a plurality of pixel electrodes, each connected to the source electrode of an associated one of said thin-film transistors;

a second step of forming a first metal film with a low resistance on said plurality of thin-film transistors and said plurality of pixel electrodes and a second metal film on said first metal film;

a third step of forming a photoresist film on said second metal film, and exposing the photoresist film, and developing said photoresist film with a developer solution into a resist pattern formed on data line formation regions, during the developing, the second metal film blocking the developer solution from penetrating through pin holes of the first metal film for preventing a cell reaction between said first metal film and said plurality of pixel electrodes from occurring;

a fourth step of etching said first metal film and second metal film with the resist pattern as an etching mask, for forming data lines formed of a remaining portion of said first metal film and connecting the drain electrodes of the thin-film transistors, and a metal pattern formed of remaining portions of said second metal film and formed on the data lines; and a fifth step of eliminating said metal pattern after said fourth step of etching.

5. The method according to claim 4, wherein said pixel electrodes are formed of ITO, said first metal film is formed of a material selected from the group consisting of aluminum and aluminum alloy, and said second metal film is formed of chromium.

6. The method according to claim 4, wherein said fifth step includes:

a step of forming a second photoresist film to cover at least source electrodes and drain electrodes and being out of covering relation with said second metal pattern; and a step of eliminating said metal pattern.

* * * * *